United States Patent
Sun

(10) Patent No.: US 9,472,784 B2
(45) Date of Patent: Oct. 18, 2016

(54) PACKAGING STRUCTURE FOR OLED HAVING INORGANIC AND ORGANIC FILMS WITH MOISTURE ABSORBENT LAYERS

(71) Applicant: BOE TECHNOLOGY GROUP CO., LTD., Beijing (CN)

(72) Inventor: Li Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/415,481

(22) PCT Filed: May 23, 2014

(86) PCT No.: PCT/CN2014/078273
§ 371 (c)(1),
(2) Date: Jan. 16, 2015

(87) PCT Pub. No.: WO2015/089998
PCT Pub. Date: Jun. 25, 2015

(65) Prior Publication Data
US 2016/0043347 A1  Feb. 11, 2016

(30) Foreign Application Priority Data
Dec. 20, 2013 (CN) .......................... 2013 1 0711653

(51) Int. Cl.
*H01L 51/52* (2006.01)
*B32B 27/08* (2006.01)
(Continued)

(52) U.S. Cl.
CPC ........... *H01L 51/5256* (2013.01); *B32B 27/08* (2013.01); *B32B 27/281* (2013.01);
(Continued)

(58) Field of Classification Search
CPC ........... H01L 51/5237; H01L 51/5253; H01L 51/5256; H01L 51/5259
See application file for complete search history.

(56) References Cited

U.S. PATENT DOCUMENTS 7,663,312 B2    2/2010  Anandan
2007/0159096 A1*  7/2007  Oh et al. ........................ 313/512
(Continued)

FOREIGN PATENT DOCUMENTS

CN    101128074 A    2/2008
CN    101859792 A    10/2010
(Continued)

OTHER PUBLICATIONS

First Office Action regarding Chinese Application No. 201310711653.6, dated Jul. 27, 2015.
(Continued)

*Primary Examiner* — Kevin Parendo
(74) *Attorney, Agent, or Firm* — Harness, Dickey & Pierce, P.L.C.

(57) ABSTRACT

The present invention provides a film packaging structure for an OLED, an OLED device, and a display apparatus. The film packaging structure for an OLED is an OLED film packaging structure, which includes a flexible film for packaging an OLED unit. The flexible film includes at least one layer of inorganic film, and at least one layer of organic film which is alternately stacked with the at least one layer of inorganic film. Each layer of organic film in the at least one layer of organic film is an integral film, and each layer of inorganic film in the at least one layer of inorganic film includes a plurality of non-connected inorganic film segments. The display apparatus includes the OLED device. The OLED film packaging structure, the OLED device and the display apparatus utilize inorganic films and organic films which are alternately stacked with the inorganic films.

13 Claims, 3 Drawing Sheets

(51) Int. Cl.
*B32B 27/28* (2006.01)
*B32B 27/32* (2006.01)
*H01L 51/00* (2006.01)

(52) U.S. Cl.
CPC ............ *B32B 27/32* (2013.01); *H01L 51/004* (2013.01); *H01L 51/5259* (2013.01); *B32B 2255/10* (2013.01); *B32B 2255/20* (2013.01); *B32B 2307/7265* (2013.01); *B32B 2439/00* (2013.01); *B32B 2457/206* (2013.01); *H01L 2251/301* (2013.01); *H01L 2251/303* (2013.01); *H01L 2251/5338* (2013.01)

(56) References Cited

U.S. PATENT DOCUMENTS

| | | | |
|---|---|---|---|
| 2008/0012477 A1* | 1/2008 | Koo et al. | 313/504 |
| 2009/0075098 A1* | 3/2009 | Tsukahara et al. | 428/451 |
| 2009/0091257 A1* | 4/2009 | Yoshinaga | 313/505 |
| 2009/0108748 A1* | 4/2009 | Toyoda et al. | 313/504 |
| 2011/0121270 A1* | 5/2011 | Kim et al. | 257/40 |
| 2011/0248907 A1* | 10/2011 | Lee et al. | 345/76 |
| 2013/0037792 A1 | 2/2013 | Kim et al. | |

FOREIGN PATENT DOCUMENTS

| | | |
|---|---|---|
| CN | 102437288 A | 5/2012 |
| CN | 102903728 A | 1/2013 |
| CN | 102969251 A | 3/2013 |
| CN | 103165821 A | 6/2013 |
| CN | 103258955 A | 8/2013 |
| CN | 203134801 U | 8/2013 |
| CN | 103325953 A | 9/2013 |
| CN | 103715366 A | 4/2014 |
| KR | 20090128301 A | 12/2009 |
| KR | 20120075055 A | 7/2012 |

OTHER PUBLICATIONS

Abstract of "*The Study of a Multilayer of Organic Inorganic Hybrid Thin Film Encapsulation Structure for Organic Light-emitting Diodes.*" provided by Dragon Intellectual Property Law Firm.
Written Opinion of the International Searching Authority of application No. PCT/CN2014/078273.
"*The Study of a Multilayer of Organic and Inorganic Hybrid Thin Film Encapsulation Structure for Organic Light-Emitting Diodes*". Translation provided by Dragon Intellectual Property Law Firm.
Second Office Action regarding Chinese application No. 201310711653.6, dated Dec. 17, 2015. Translation provided by Dragon Intellectual Property Law Firm.
Third Office Action regarding Chinese application No. 201310711653.6, dated Apr. 25, 2016. Translation provided by Dragon Intellectual Property Law Firm.

* cited by examiner

US 9,472,784 B2

PACKAGING STRUCTURE FOR OLED HAVING INORGANIC AND ORGANIC FILMS WITH MOISTURE ABSORBENT LAYERS

CROSS-REFERENCE TO RELATED APPLICATION

This application is the U.S. national phase of PCT Application No. PCT/CN2014/078273 filed on May 23, 2014, which claims priority to Chinese Patent Application No. 201310711653.6 filed on Dec. 20, 2013, the disclosures of which are incorporated in their entirety by reference herein.

TECHNICAL FIELD

The present invention relates to the field of electroluminescence, in particular to a film packaging structure for an OLED (Organic Light-Emitting Diode), an OLED device and a display apparatus.

BACKGROUND

In recent years, organic electroluminescent display, as a new flat panel display, is getting more and more attention. The organic electroluminescent display features to lightness and thinness, wide viewing angle, low power consumption, fast response, flexible display, etc. Being an active light emitting, device, it is considered to have a great advantage in terms of high-definition and high-speed screen, and is making, progress toward a practical using direction recently. Core part of organic electroluminescent display is organic electroluminescent device, namely, OLED unit.

An organic film layer of the OLED unit in the organic electroluminescent device is easy to lose effectiveness because of suffering from water-oxygen corrosion, and therefore, it is required to be protected with a packaging structure for isolating from water-oxygen. Usually, hard packaging substrate (such as glass, metal sheet) with high water resistance performance is used in this field. That is to say, outside the OLED unit, two substrates for supporting the OLED unit are bonded via packaging adhesive, and an airtight space which water-oxygen is difficult to penetrate is formed between two substrates. This method can protect the OLED unit effectively, but is not suitable for flexible devices. Thus, there is a technical solution that a film having a certain water resistance performance is provided outside the OLED unit. But a dense film often has bad bendability, for example, SiOx film. Moreover, a film with good bendability has bad water resistance performance, for example, polymer film. There is also a technical solution that a multilayered film packaging structure is provided outside the OLED unit, in which multilayered organic films and inorganic films are alternately stacked to obtain better bendability and water resistance performance, but the multilayered film packaging structure has multiple layers, resulting in multisteps manufacturing process, costing long time, and depending on quality of film layers severely, especially the quality of inorganic film layers. A large area of inorganic film easily ruptures during bending, so as to form new water molecules corrosion pathway, thereby degrading the performance of the packaging structure.

SUMMARY

An object of the present invention is to provide a film packaging structure for an OLED with a better waterproof performance, an OLED device and a display apparatus.

A film packaging structure for an OLED according to an embodiment of the present invention comprises a flexible film for packaging an OLED unit. The flexible film comprises at least one layer of inorganic film, and at least one layer of organic film which is alternately stacked with the at least one layer of inorganic film. Each layer of organic film in the at least one layer of organic film is an integral film, and each layer of inorganic film in the at least one layer of inorganic film comprises a plurality of non-connected inorganic film segments. Because the inorganic film is separated into a plurality of non-connected inorganic film segments with smaller area, the chance for rupture of the film packaging structure for the OLED during bending reduces, and the water resistance performance thereof is increased.

Optionally, a plurality of cavities is provided between a plurality of inorganic film segments for making the inorganic film segments non-connected with each other.

Optionally, the cavities are provided in the inorganic film between two layers of organic film for separating the inorganic film into a plurality of non-connected strip-typed inorganic film segments which extends along the organic film. The shape of the strip-typed inorganic film segments is favorable for convenience of processing.

Optionally, a moisture absorbent layer is provided in a plurality of cavities respectively. The moisture absorbent layer may guide water molecules to penetrate on the one hand, and absorb the water molecules on penetration path of the water molecules on the other hand, which helps to increase the water resistance performance of the film packaging structure for the OLED.

Optionally, the moisture absorbent layer in the cavity is in contact with an adjacent organic film so that the inorganic film is separated into a plurality of non-connected inorganic film segments.

Optionally, a plurality of cavities in the inorganic film and a plurality of cavities in an adjacent inorganic film are arranged in a staggered manner. This structure helps to increase the water resistance performance, and may effectively prevent the formation of permeable pathway among cavities or moisture absorbent layers between upper and lower layers.

Optionally, the inorganic film has the same thickness as the moisture absorbent layer.

Optionally, the inorganic film has a smaller thickness than the organic film so that the organic film can package the inorganic film, and further strength and durability of the film packaging structure for the OLED are ensured.

Optionally, the film packaging structure for the OLED comprises a substrate for supporting the OLED unit, and the flexible film and the substrate are enclosed to form an accommodating space for accommodating the OLED unit.

Optionally, the inorganic film comprises an inorganic material with a water resistance performance, and the organic film comprises an organic filmable material with a water resistance performance.

Optionally, the inorganic film comprises alumina, silicon dioxide, magnesium oxide, titanium dioxide, silicon nitride, silicon oxynitride and/or molybdenum oxide, and so on; the organic film comprises polyacrylic ester, polyimide, and/or polyethylene, and so on.

Optionally, the moisture absorbent layer comprises calcium oxide, silica gel and/or porous silicon, and so on.

Optionally, a total area of the inorganic film segments in the at least one layer of inorganic film is greater than a total area of the cavities to increase the water resistance performance.

An OLED device according to an embodiment of the present invention, comprises an OLED unit, and above film packaging structure for the OLED for packaging the OLED unit.

A display apparatus according to an embodiment of the present invention comprises above OLED device.

Because the inorganic film is separated into a plurality of non-connected inorganic film segments with smaller area, the chance for rupture of the film packaging structure for OLED in the present invention during bending reduces, and the water resistance performance thereof is increased.

DETAILED DESCRIPTION

The invention will be further described in detail hereinafter in conjunction with the drawings and embodiments so that a person skilled in the art can better understand and carry out the invention, but the embodiments description are not regarded as limitation to the invention.

Example 1

Figure 1:
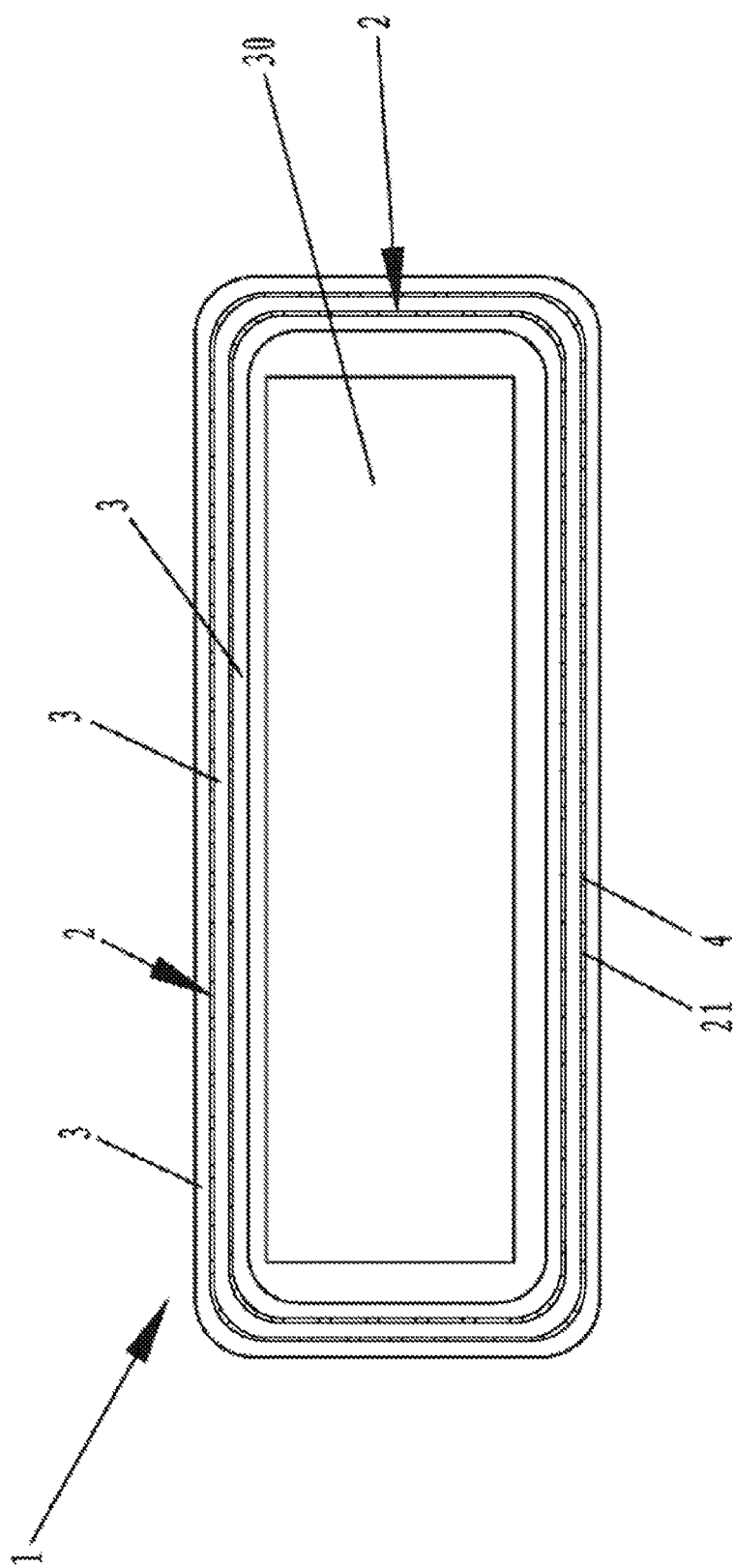
FIG. 1 is a schematic view showing the structure of a film packaging structure for an OLED according to Example 1 of the present invention.
Figure 3:
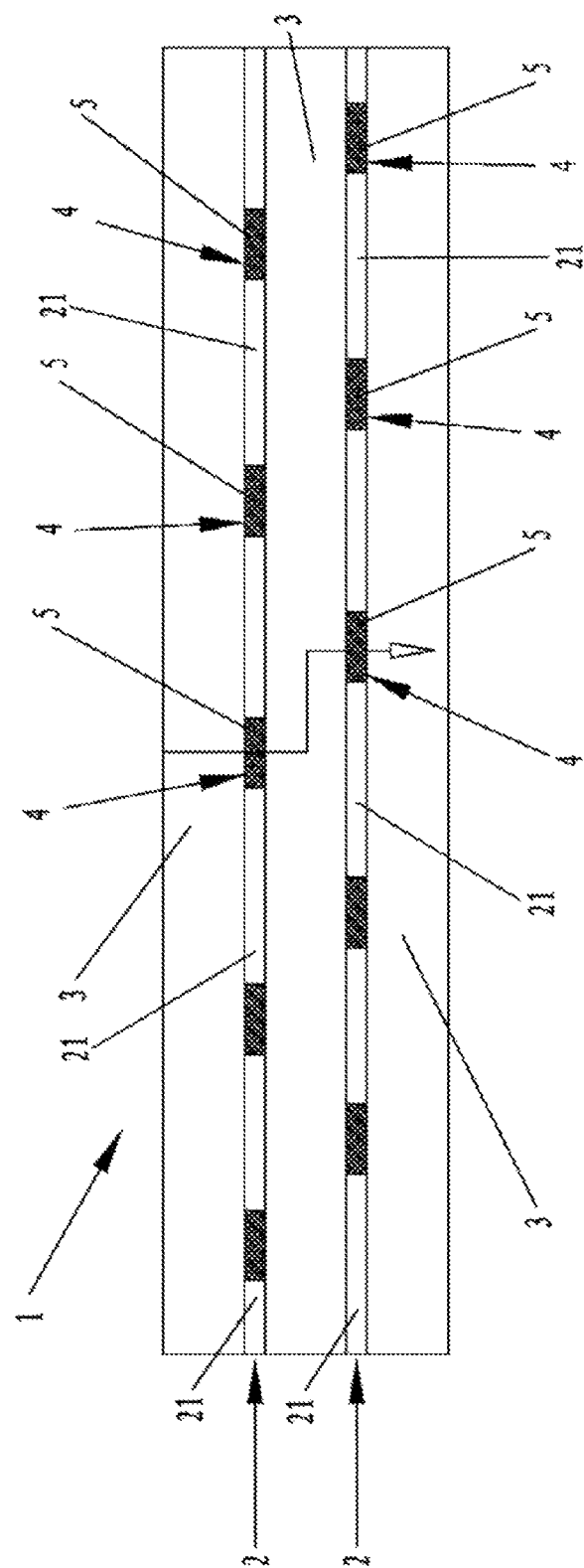
FIG. 3 is a schematic view showing the partially enlarged structure of a flexible film according to the embodiment of the present invention.

As shown in FIGS. 1 and 3, a film packaging structure for an OLED according to the present invention comprises a flexible film 1 for packaging an OLED unit 30. The flexible film 1 comprises inorganic films 2 and organic films 3 which are alternately stacked with the inorganic films 2. The inorganic film 2 between two organic films 3 is provided with a plurality of cavities 4 for separating the inorganic film 2. The cavities 4 separate the inorganic film 2 into a plurality of non-connected strip-typed inorganic film segments 21 which extends along an extension direction of the organic films 3.

The shape of the inorganic film segments 21 is not limited to the strip type as shown in the figures, and may be in a regular or irregular shape so long as they are not connected with each other.

Specific material of the inorganic film 2 may be any suitable inorganic material with a water resistance performance, preferably, for example, alumina, silicon dioxide, magnesium oxide, titanium dioxide, silicon nitride, silicon oxynitride and/or molybdenum oxide, and so on.

Specific material of the organic film 3 may be any suitable organic filming material with a water resistance performance, preferably, flexible organic filmable material, and further preferably, for example, polyacrylic ester, polyimide, and/or polyethylene, and so on.

According to requirements, for the flexible film 1 provided with multilayered organic film 3 and multilayered inorganic film 2, the organic films 3 and the inorganic films 2 may respectively use the same or different material(s). The specific number of layers of the organic films 3 and inorganic films 2 can be selected according to requirements.

In the film packaging structure for the OLED according to the embodiment of the invention, optionally, a total area of the inorganic film segments 21 is more than a total area of the cavities 4, which is favorable for increasing water resistance performance.

In the film packaging structure for the OLED according to the embodiment of the invention, optionally, a moisture absorbent layer 5 is provided in a plurality of cavities 4. The moisture absorbent layer 5 may be provided in all of the cavities, or a part of the cavities according to requirements.

The material of the moisture absorbent layer 5 may be any suitable material with moisture absorption ability, optionally, for example, calcium oxide, silica gel and/or porous silicon, and so on.

In the film packaging structure for the OLED according to the embodiment of the invention, optionally, the moisture absorbent layer 5 in the cavities 4 is in contact with the organic film 3 on both sides of the inorganic film 2 respectively so that the inorganic film 2 is separated into a plurality of non-connected inorganic film segments 21 which extends along the extension direction of the organic film 3.

In the film packaging structure for the OLED according to the embodiment of the invention, optionally, a plurality of cavities or moisture absorbent layer 5 in an inorganic film 2 and in an adjacent inorganic film 2 are arranged in a stagger manner, and none of them are arranged right oppositely. Such a structure helps to increase the water resistance performance, capable of preventing formation of permeable pathway among cavities 4 or moisture absorbent layers 5 between the upper layer and the lower layer.

In the film packaging structure for the OLED according to the embodiment of the invention, optionally, the inorganic film 2 has the same thickness as the moisture absorbent layer 5 so as to help to increase the bondability of the inorganic film segments 21 and the moisture absorbent layer 5 with the organic film 3 adjacent thereto, and further increase the water resistance performance of the flexible film 1.

In the film packaging structure for the OLED according to the embodiment of the invention, optionally, the inorganic film 2 has a smaller thickness than the organic film 3 so that the organic film 3 can package the inorganic film 2, and further the strength and the durability of the OLED film packaging structure are ensured.

Example 2

Figure 2:
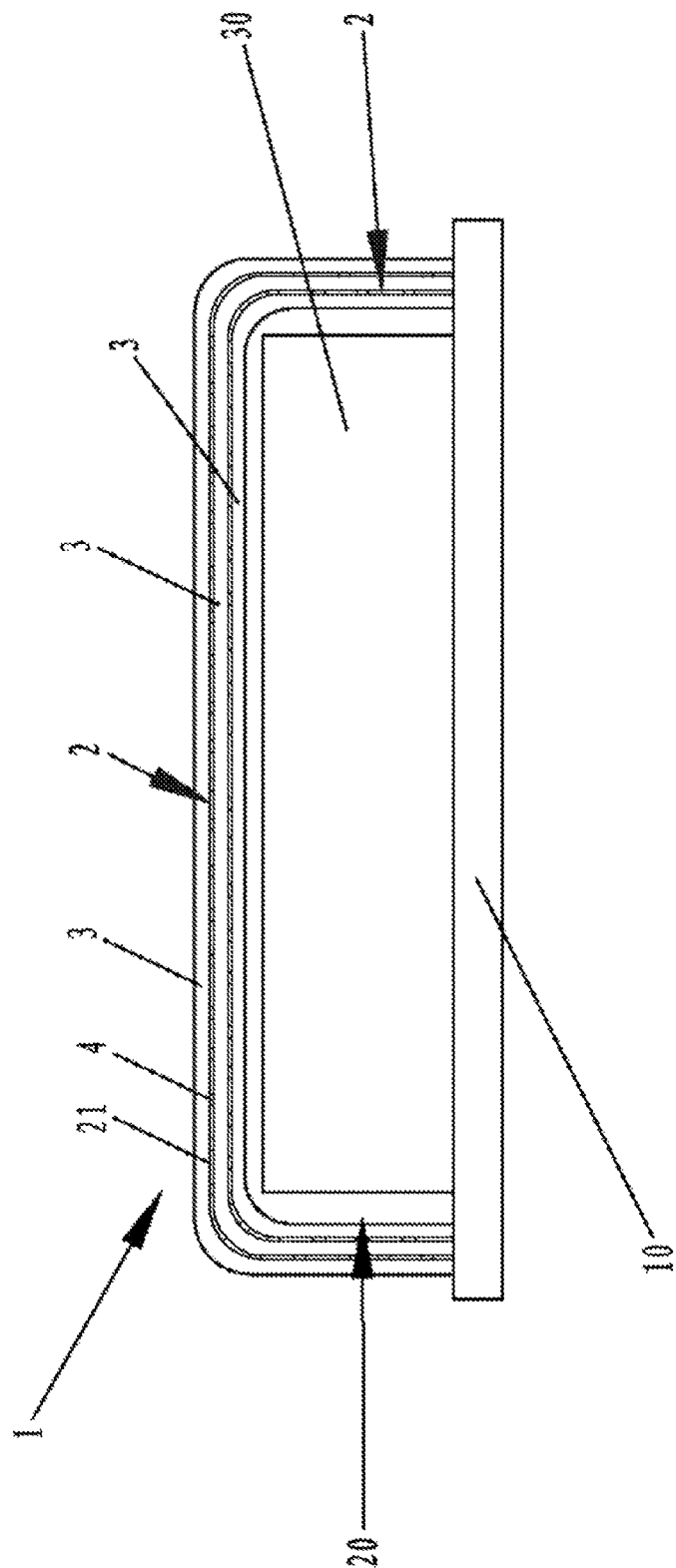
FIG. 2 is a schematic view showing the structure of a film packaging structure for an OLED according to Example 2 of the present invention.

With reference to FIGS. 2 and 3, a film packaging structure for an OLED according to the invention comprises a flexible film 1 in Example 1. In Example 1, an OLED unit 30 is entirely packaged by the flexible film 1. In the present embodiment, the OLED unit 30 is not entirely packaged by the flexible film 1, and further comprises a substrate 10 for supporting the OLED unit 30. The flexible film 1 and the substrate 10 are enclosed to form an accommodating space 20 for accommodating the OLED unit 30.

The substrate 10 may be a substrate commonly used in the art.

An OLED device comprises an OLED unit and a film packaging structure for an OLED according to the embodiment of the invention for packaging the OLED unit.

A display apparatus comprises an OLED device according to the present invention.

The film packaging structure for the OLED of the invention makes the inorganic film to be a discontinuous structure in a multilayered packaging structure, and coats moisture absorbent layer in cavities of the same inorganic film. The hollow arrow in FIG. 3 shows a penetrating route of water molecules. The film packaging structure for the OLED in the invention guides water molecules to penetrate on the one hand, and absorbs the water molecules on their penetration path on the other hand, such that the water resistance performance of multilayered film packaging structure is increased. Because the inorganic film is separated into a plurality of non-connected inorganic film segments with smaller area, the chance for rupture during bending reduces, and the water resistance performance is maintained substantially.

The inorganic film in the film packaging structure for the OLED of Examples 1 and 2 may be made by physical or chemical deposition, then the discontinuous regular arrangement may be formed via the method of metal mask plate or dry etching and separating. The moisture absorbent layer may be formed by coating or physical deposition, followed by finally arranging it only in gaps of the inorganic film via method of ashing, separating and dry etching, and so on. And then, precursors of organic film may be formed by spraying and scrapping. The organic film may be formed by UV curing or heat curing. And then the steps of forming the inorganic film, the moisture absorbent layer and the organic layer may be repeated to finally obtain the film packaging structure for the OLED in the embodiments of the invention.

The film packaging structures for the OLED, the OLED device, and the display apparatus in all embodiments according to the present invention use inorganic films and organic film which are alternately stacked with the inorganic film, and the inorganic film is formed as non-connected structure to achieve better water resistance performance, and meanwhile, the structure is easy to facilitate preparation.

The above description only shows some preferable embodiments of the invention, and it should be pointed out that, for one of ordinary skills in the art, many improvements and modifications can be made without departing from the spirit of the present invention, and all these improvements and modifications fall into the protection scope of the invention.

What is claimed is:

1. A film packaging structure for an OLED, comprising: a flexible film for packaging an OLED unit, the flexible film comprising at least one layer of inorganic film, and at least one layer of organic film which is alternately stacked with the at least one layer of inorganic film, wherein each layer of organic film in the at least one layer of organic film is an integral film and is a continuous film, and each layer of inorganic film in the at least one layer of inorganic film comprises a plurality of non-connected inorganic film segments;
   wherein each layer of inorganic film in the at least one layer of inorganic film comprises a plurality of cavities between the plurality of non-connected inorganic film segments;
   wherein a moisture absorbent layer is provided in at least one of the plurality of cavities;
   wherein each layer of inorganic film in the at least one layer of inorganic film has the same thickness as the moisture absorbent layer.

2. The film packaging structure for the OLED according to claim 1, wherein each layer of inorganic film in the at least one layer of inorganic film is separated by the plurality of cavities into a plurality of non-connected strip-typed inorganic film segments.

3. The film packaging structure for the OLED according to claim 1, wherein the moisture absorbent layer in the at least one of the plurality of cavities is in contact with one layer of organic film in the at least one layer of organic film adjacent to the moisture absorbent layer, so that one layer of inorganic film in the at least one layer of inorganic film which the moisture absorbent layer is in is separated into segments of the plurality of non-connected inorganic film segments.

4. The film packaging structure for the OLED according to claim 1, wherein a first plurality of cavities in one layer of inorganic film in the at least one layer of inorganic film and a second plurality of cavities in an adjacent layer of inorganic film in the at least one layer of inorganic film are arranged in a staggered manner.

5. The film packaging structure for the OLED according to claim 1, wherein each layer of inorganic film in the at least one layer of inorganic film has a smaller thickness than each layer of organic film in the at least one layer of organic film.

6. The film packaging structure for the OLED according to claim 1, further comprising a substrate for supporting the OLED unit, wherein the flexible film and the substrate together define an enclosure having an accommodating space for accommodating the OLED unit.

7. The film packaging structure for the OLED according to claim 1, wherein each layer of inorganic film in the at least one layer of inorganic film is made of an inorganic material with a water resistance performance, and each layer of organic film in the at least one layer of organic film is made of an organic material with a water resistance performance.

8. The film packaging structure for the OLED according to claim 1, wherein each layer of inorganic film in the at least one layer of inorganic film comprises alumina, silicon dioxide, magnesium oxide, titanium dioxide, silicon nitride, silicon oxynitride and/or molybdenum oxide;
   each layer of organic film in the at least one layer of organic film comprises polyacrylic ester, polyimide, and/or polyethylene.

9. The film packaging structure for the OLED according to claim 1, wherein the moisture absorbent layer comprises calcium oxide, silica gel and/or porous silicon.

10. The film packaging structure for the OLED according to claim 1, wherein a total area of the inorganic film segments in the at least one layer of inorganic film is greater than a total area of the cavities.

11. An OLED device, comprising an OLED unit, and a film packaging structure for an OLED for packaging the OLED unit, the film packaging structure for the OLED comprising:
   a flexible film for packaging the OLED unit, the flexible film comprising at least one layer of inorganic film, and at least one layer of organic film which is alternately stacked with the at least one layer of inorganic film, wherein each layer of organic film in the at least one layer of organic film is an integral film and is a continuous film, and each layer of inorganic film in the at least one layer of inorganic film comprises a plurality of non-connected inorganic film segments;
   wherein each layer of inorganic film in the at least one layer of inorganic film comprises a plurality of cavities between the plurality of non-connected inorganic film segments;
   wherein a moisture absorbent layer is provided in at least one of the plurality of cavities;
   wherein each layer of inorganic film in the at least one layer of inorganic film has the same thickness as the moisture absorbent layer.

12. The OLED device according to claim 11, wherein a first plurality of cavities in one layer of inorganic film in the at least one layer of inorganic film and a second plurality of cavities in an adjacent layer of inorganic film in the at least one layer of inorganic film are arranged in a staggered manner.

13. A display apparatus, comprising an OLED device,
the OLED device comprises an OLED unit and a film packaging structure for an OLED, the film packaging structure for the OLED comprises:
a flexible film for packaging the OLED unit, the flexible film comprising at least one layer of inorganic film, and at least one layer of organic film which is alternately stacked with the at least one layer of inorganic film, wherein each layer of organic film in the at least one layer of organic film is an integral film and is a continuous film, and each layer of inorganic film in the at least one layer of inorganic film comprises a plurality of non-connected inorganic film segments;
wherein each layer of inorganic film in the at least one layer of inorganic film comprises a plurality of cavities between the plurality of non-connected inorganic film segments;
wherein a moisture absorbent layer is provided in at least one of the plurality of cavities;
wherein each layer of inorganic film in the at least one layer of inorganic film has the same thickness as the moisture absorbent layer.

\* \* \* \* \*